United States Patent [19]

Kovacs et al.

[11] Patent Number: 4,719,459
[45] Date of Patent: Jan. 12, 1988

[54] SIGNAL DISTRIBUTION SYSTEM SWITCHING MODULE

[75] Inventors: Eddie T. Kovacs, Kings Park; Donald J. Eivers, Massapequa, both of N.Y.

[73] Assignee: Grumman Aerospace Corporation, Bethpage, N.Y.

[21] Appl. No.: 836,929

[22] Filed: Mar. 6, 1986

[51] Int. Cl.⁴ .................. H04Q 11/00; G01R 31/28
[52] U.S. Cl. ..................... 340/825.800; 324/73 R; 371/20
[58] Field of Search ............. 340/825.79, 825.8; 371/11, 15, 20; 364/579, 580; 324/73 R

[56] References Cited

U.S. PATENT DOCUMENTS

| | | | |
|---|---|---|---|
| 2,978,641 | 4/1961 | Voegtlen | 340/825.79 |
| 3,050,680 | 8/1962 | Fox | 324/51 |
| 3,245,034 | 4/1966 | Steinbuch et al. | 371/36 |
| 3,781,826 | 12/1973 | Beausoleil | 371/11 |
| 3,781,829 | 12/1973 | Singh | 371/27 |
| 3,897,626 | 8/1978 | Beausoleil | 29/574 |
| 3,995,261 | 11/1976 | Goldberg | 371/11 |
| 4,250,556 | 2/1981 | Goser | 364/600 |
| 4,300,207 | 11/1981 | Eivers et al. | 371/20 |
| 4,392,107 | 7/1983 | Gollomp | 324/73 R |
| 4,397,021 | 8/1983 | Lloyd et al. | 371/20 |
| 4,402,055 | 8/1983 | Lloyd et al. | 371/20 |
| 4,489,403 | 12/1984 | Bond | 371/11 |
| 4,620,304 | 10/1986 | Faran, Jr. et al. | 324/73 R |

OTHER PUBLICATIONS

Fasciano, N. T. et al., "Computer Aided Test of Sensor Based Systems," IBM Technical Disclosure Bulletin, vol. 14, No. 10, Mar. 1972, pp. 3067–3068.

Primary Examiner—Donald J. Yusko
Attorney, Agent, or Firm—Pollock, VandeSande & Priddy

[57] ABSTRACT

The signal distribution function in a signal distribution system is performed in a switching matrix under the control of a hybrid controller. With respect to the switching matrix, there are approximately 120–140 available interface I/O connections such that an equipment under test can be selectively connected to any one of a plurality of test instruments. The relays within the switching matrix are selectively activated such that a signal path connecting the equipment under test to a particular test instrument can be accomplished with a minimum amount of switching path conflicts.

13 Claims, 6 Drawing Figures

SIGNAL DISTRIBUTION SYSTEM SWITCHING MODULE

FIELD OF THE INVENTION

The present invention is directed to a signal distribution system, and more particularly to a switching matrix within the signal distribution system.

BRIEF DESCRIPTION OF THE PRIOR ART

The most relevant known prior art is the multiple matrix switching system (MMS), which has been thoroughly described in U.S. Pat. No. 4,300,207, issued to the present inventors and assigned to the same assignee herein, Grumman Aerospace Corporation. The MMS system utilizes multiple I/O switch matrix cards and instrument cards for connecting an equipment under test to a test instrument. The present invention, like the MMS system, is intended to be used as an automatic test equipment system for testing various avionic electronic systems.

For the MMS system, multiple I/O switch matrix cards are used in conjunction with instrument matrix cards for connecting the equipment under test to a test instrument. However, this system would work adequately so long as the space available for the system is unlimited—in terms of the number of IC chips which can be placed in an area having a certain dimension. However, as the number of equipment under test and the number of test instruments increase, miniaturization of the automatic testing system, particularly in terms of combining the I/O switch matrix functions and the instrument matrix functions via the I/O switch matrix cards and instrument matrix cards, respectively, is needed.

BRIEF DESCRIPTION OF THE PRESENT INVENTION

The present invention is directed to a switching matrix used in an automatic test equipment system for performing the signal distribution function in that system. This switching system would take approximately 120-140 interface I/O (input/output) connections by means of a combination of I/O interfaces, digital lines, matrix buses, a multiple number of relays and an intercard signal bus. By combining all the above-cited elements into a single switching matrix, an equipment under test can be selectively switched to at least one of a myriad of test instruments, the number of which is greater than that which was available for the MMS system.

The above-mentioned objects and advantages of the present invention will be more clearly understood when considered in conjunction with the accompanying drawings, in which:

DETAILED DESCRIPTION OF THE PRESENT INVENTION

Figure 1:
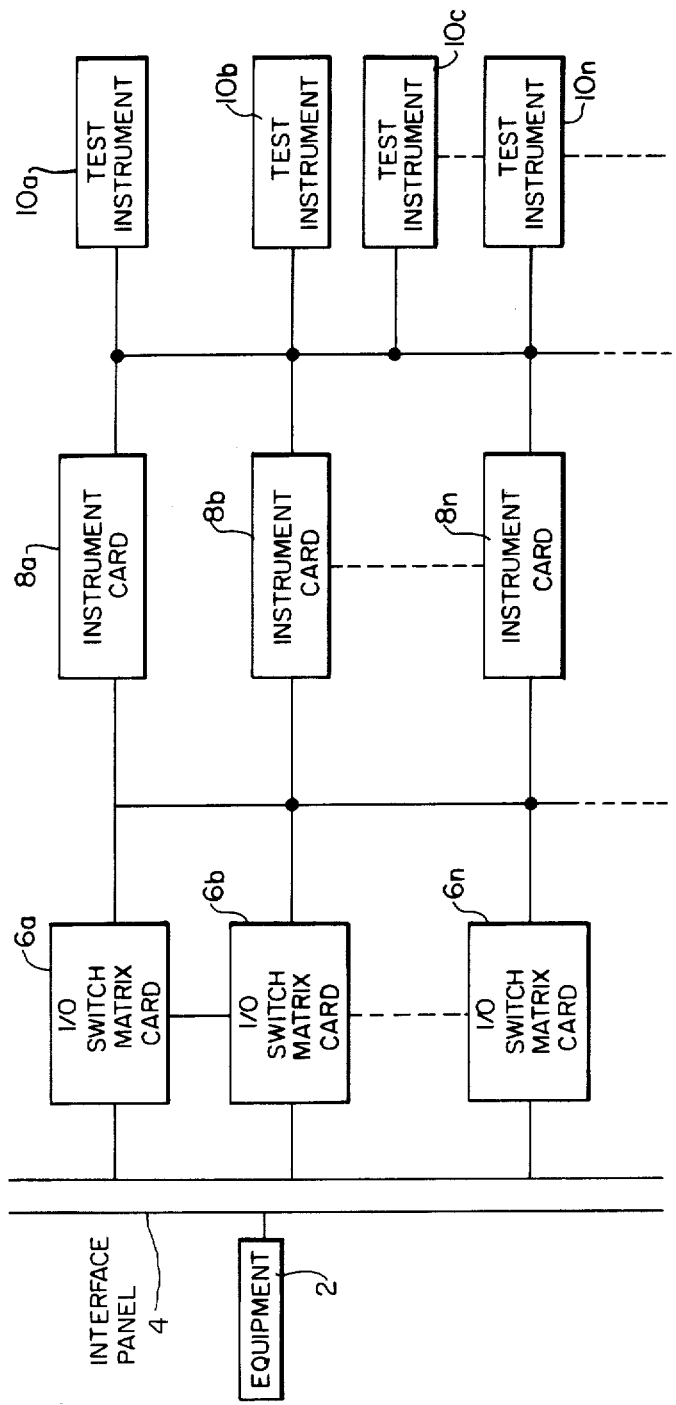
FIG. 1 shows a prior art multiple matrix switching system.

In the prior art MMS system shown in FIG. 1, equipment 2 is connected via interface panel 4 to any one of I/O switch matrix cards 6a-6n. The switch matrix cards in turn are connected to corresponding instrument cards 8a-8n. For the MMS system, there are three identical I/O switch matrix cards and four identical instrument matrix cards. The instrument cards have multiple outputs which would allow each card to be connected to a plurality of test instruments 10a-10n. Under computer control, the various switch matrix cards and instrument cards would energize various relays therein to make the proper connections—that is, providing a signal path between equipment 2 and one of the test instruments. For the MMS system, both I/O switch matrix cards and instrument cards are needed for providing this signal path.

Figure 2:
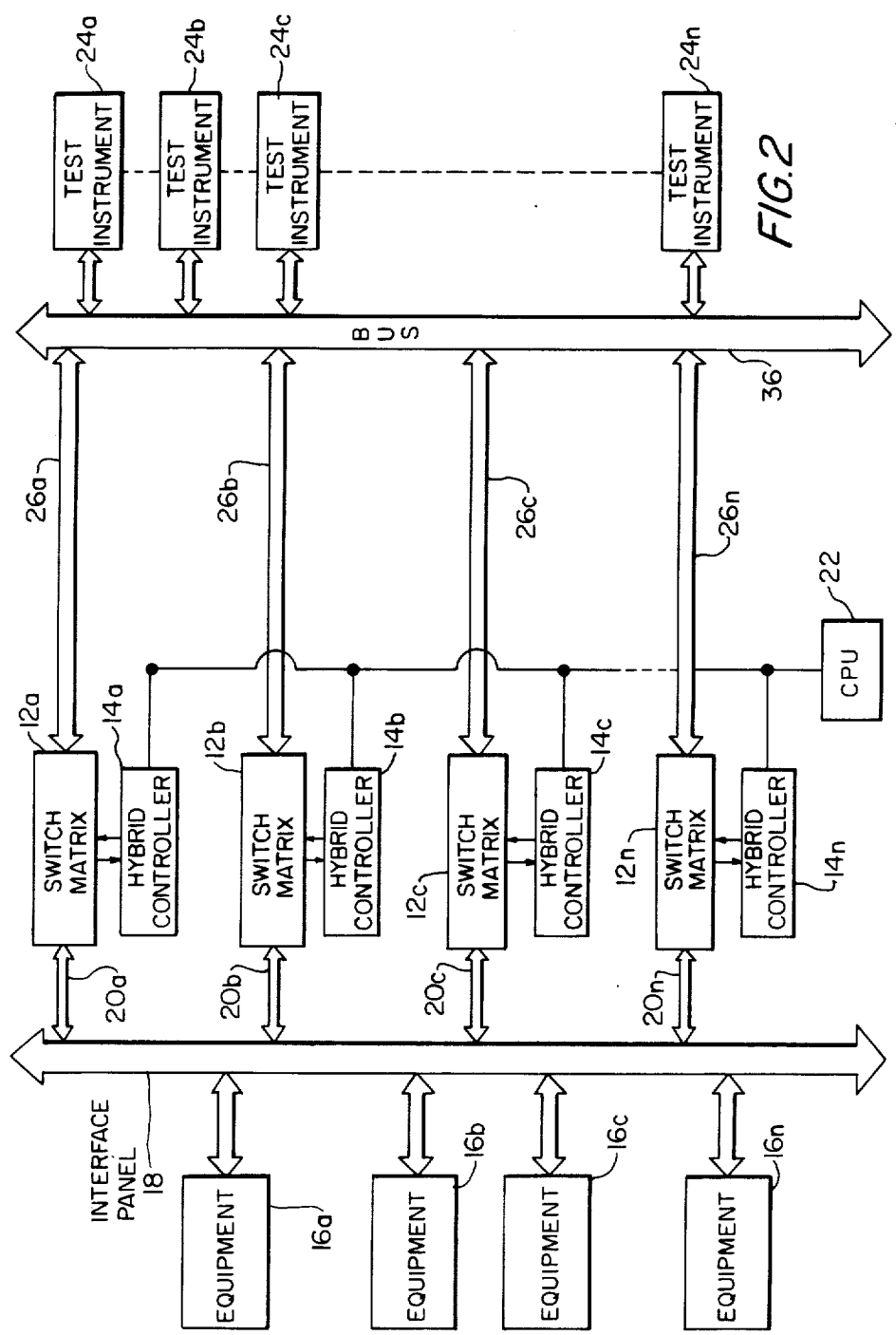
FIG. 2 shows an overall signal distribution system, which is described in co-pending application by the same inventors Ser. No. 836927, and assigned to the same assignee.

Referring now to FIG. 2, there is shown an overall signal distribution system of the present invention. As discussed at length in co-pending application Ser. No. 836927, the present automatic equipment testing system includes miniaturized switching matrices 12a-12n. The matrices are controlled by hybrid controllers 14a-14n. Each of these switch matrices is adaptable to receive anyone of equipment under test 16a-16n via interface panel 18 and bi-directional data lines 20a-20n. Each of the hybrid controllers receives instructions from CPU 22 for selectively activating a corresponding switch matrix. Upon activation, the proper switch matrix then completes a signal path between the equipment under test and at least one of test instruments 24a-24n via bi-directional data lines 26a-26n and common bus 36.

Figure 3:
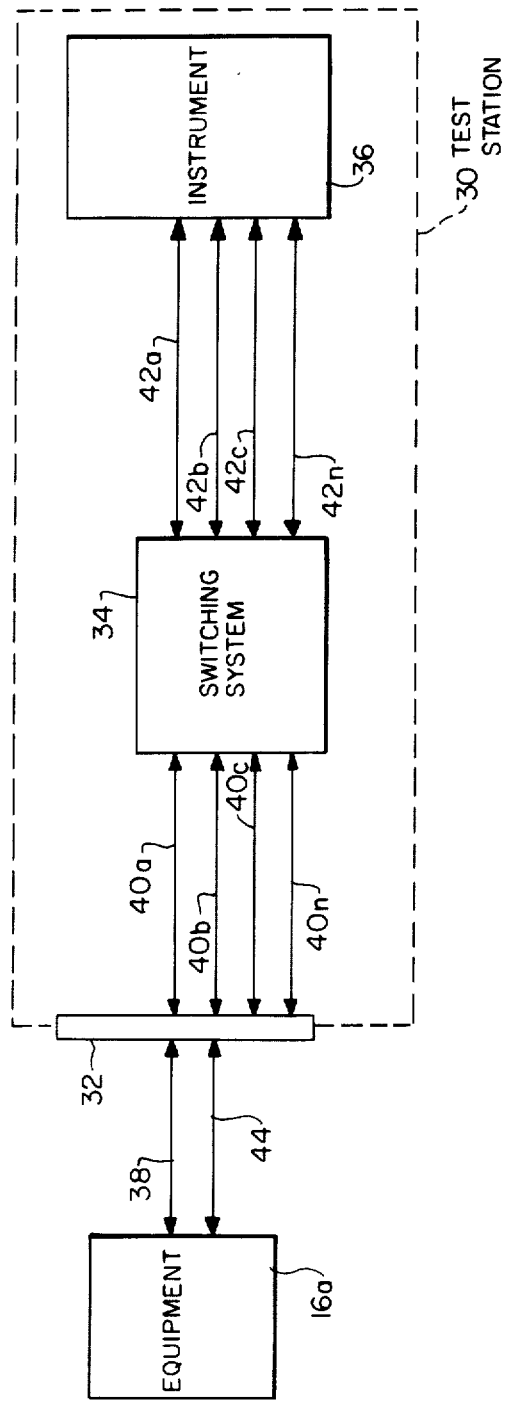
FIG. 3 shows a simplified view of the switching system of the present invention.

Referring now to FIG. 3, there is shown test station 30 of the present signal distribution system. Within test station 30 are interface panel 32, switch system 34 and instrument station 36, which includes a plurality of test instruments. In operation, an equipment under test, for example 16a, is taken from an aircraft and is connected via data line 38 to interface panel 32. Once the equipment under test is connected, the central processing unit, which is not shown in FIG. 3, instructs switching system 34 to make the various connections that are required for testing equipment 16a through data lines 40a-40n. It should be appreciated that switching system 34 effectuates different connections for different equipment under test. For example, in FIG. 3, switching system 34 may connect line 40a to 42a so as to provide a stimulus from test instrument 36 to equipment 16a. In response thereto, a signal from equipment 16a may travel through line 44 to line 40b and line 42b back to test instrument 36 as the measurement. If a different test instrument is used to test a different parameter of equipment 16a, the connections between lines 40a-40n and lines 42a-42n may be completely different.

Figure 4:
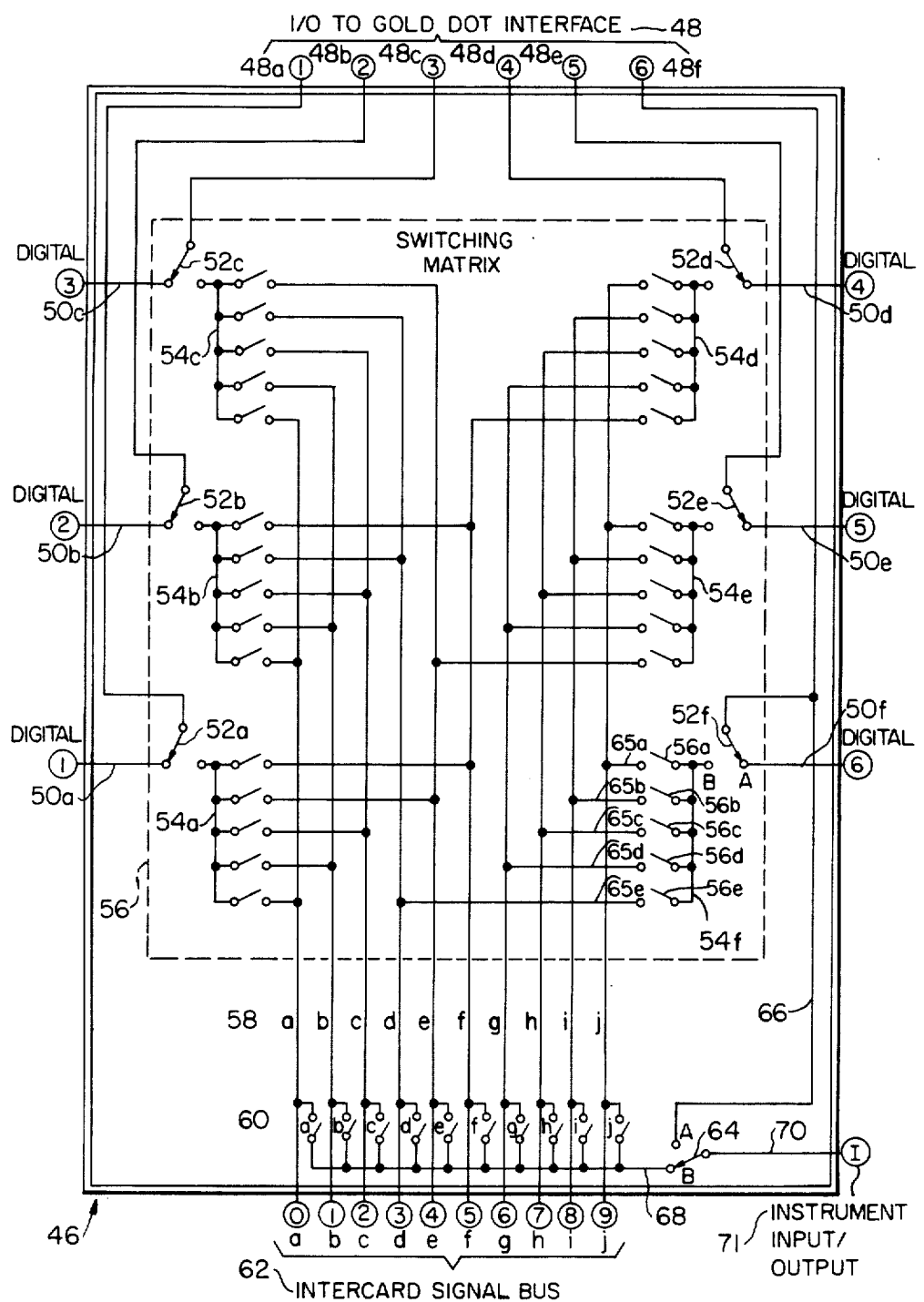
FIG. 4 depicts a diagram of a switching matrix of the present invention.

FIG. 4 illustrates but one of a plurality of switching modules which make up switching system 34. As each switching module is identical to the others, only one switching module is discussed herein. As shown, switching module 46 includes six I/O interface ports 48a-48f. The I/O ports are used to interface any equipment under test which is brought to the test station.

Also included are six digital lines 50a–50f, which are connected by means of corresponding switches 52a to 52f to respective I/O interface ports 48a–48f. A corresponding number of matrix buses 54a–54f are shown within dotted rectangle 56. As shown, each of the matrix buses has five switches, which may be made up of relays. Concentrating only on matrix bus 54f, noting that each of the matrix buses is identical, it should be noted that the relays, designated as 56a–56e, although not connected thereto as shown, may be connectable to a number of data lines 58a to 58j, collectively designated as signal bus lines 58. The signal bus lines are connected to an instrument-to-bus matrix, designated as 60. As drawn, the signal bus lines are connected to respective switches 60a to 60j in the instrument-to-bus matrix 60, which switches are relays. The signal bus lines are then extended out of switching module 46 to form an intercard signal bus 62, which has corresponding bus lines 62a to 62j. A switch 64, as shown, is connectable either via line 66 directly to I/O interface port 48f or to common bus 58 of instrument-to-bus matrix 60. Data line 70 is connected to switch 64 and extends out of switching module 46, forming an instrument input/output interface 71. As drawn, switching module 46 has completely replaced both I/O switch matrix and instrument cards of the MMS system, for example 6a and 8a, shown in FIG. 1. Hence, the switching module performs the same functions performed by both I/O switch matrix and instrument cards of the prior system.

In operation, an equipment under test, for example equipment 16a shown in FIG. 3, is connected to I/O interface 48. Supposing that one of the test points of the equipment under test is connected to I/O port 48f, it can be seen that, where switch 52f and switch 64 are respectively connected to position A, shown in FIG. 4, the signal sent out by the equipment under test would travel firstly to digital line 50f. The digital parameter of the signals can then be measured by a digital test instrument (not shown) which is connected to digital line 50f and which is capable of measuring, for instance, the repetition rate of the signal. This digital test instrument could very well be a frequency counter, for instance. Meanwhile, the analog parameters of the signals sent out by the equipment under test travel through line 66 to line 70 and out to an analog test instrument, not shown, which is connected to input/output interface 71. Many of the known analog test instruments, for example, an oscilloscope, may be used to measure the myriad of analog parameters, for example, the rise time of the signals, sent by the equipment under test.

If there are more than one analog parameters which need to be measured, switch 52f is put into position B. Thereafter, any one of the relays 56a to 56e can be connected to corresponding data lines 65a–65e. It should be noted that each one of data lines 65a–65e is connected to a different one of data lines 58a–58j. To illustrate, supposing that relay 56d is activated, thus connecting thereto data line 65d. It follows that line 65d is connected to data line 58g. Data line 58g in turn is connected to relay 60g of instrument-to-bus matrix 60. Referring back to FIG. 2, it should be remembered that each switching module is controlled by at least one hybrid controller, which selectively activates the different relays in the corresponding switch matrix. It should further be remembered that each hybrid controller in turn is controlled by a central processing unit, which instructs the hybrid controller to activate respective relays. Having said that, it should become clear that all of the relays shown in switching module 46 are controlled by a hybrid controller, which is not shown, in accordance with software instructions from a central processing unit, for example 22, shown in FIG. 2.

Return now to FIG. 4. As the term "intercard signal bus" so succinctly indicates, the ten bus lines 62a–62j of intercard signal bus 62 are connected in a common fashion to a number of cards, to be discussed with reference to FIG. 5 hereinbelow, which have switching modules that are identical to that of switching module 46. Keeping in mind that the data lines are bi-directional, it can easily then be seen that an analog signal sent out by an equipment under test from I/O interface port 48f to bus line 62g of intercard signal bus 62 can easily be routed to a different test instrument, which is connected to a different switching module located somewhere else in test station 30. This second test instrument may very well be a VCM used to measure the voltages of the analog signals.

As was mentioned previously, the analog test instrument connected to input/output interface 71 is used to measure a certain analog parameter of the signals sent out by the equipment under test, for example 16a shown in FIG. 3. Also mentioned was the fact that this test equipment, which is associated with switching module 46, may possibly be an oscilloscope used to measure the amplitudes of the analog signals. Thus, as long as it is desirable to measure the amplitudes of the signals sent by the equipment under test, for example equipment 16a, via I/O interface port 48f, switch 64 may be set at position A so that the instrument connected at input/output interface 71, in this instance, an oscilloscope, may be so continuously utilized. However, if a different equipment under test is connected to an I/O interface port at a different switching module and an oscilloscope is needed to measure the amplitudes of the analog signals sent thereby, the hybrid controller which is controlling switching module 46, upon receiving instructions from the central processing unit, can set switch 64 from position A to position B. And assuming that the to-be-measured signal from the different switching module is put onto signal bus 62h, the hybrid controller controlling switching module 46 can then close relay 60h of instrument-to-bus matrix 60, such that a signal path connecting the second equipment under test, which is connected to a different switching module and which is put on signal bus 62h, can be completed via switch 64 to data line 70 to input/output interface 71, thereby to the oscilloscope connected thereto. Therefore, the oscilloscope, which is connected to input/output interface 72, can also be used to measure the amplitudes of different signals sent out by different equipment under test connected to different I/O interfaces of different switching modules, provided that all of the hybrid controllers are controlled by a central processing unit, or at least coordinated by the same. Thus, any equipment under test can be connected to any of the available I/O interfaces and, as long as proper closure of the appropriate relays are effected, any equipment can be tested by at least one of the available test instruments.

Figure 5:
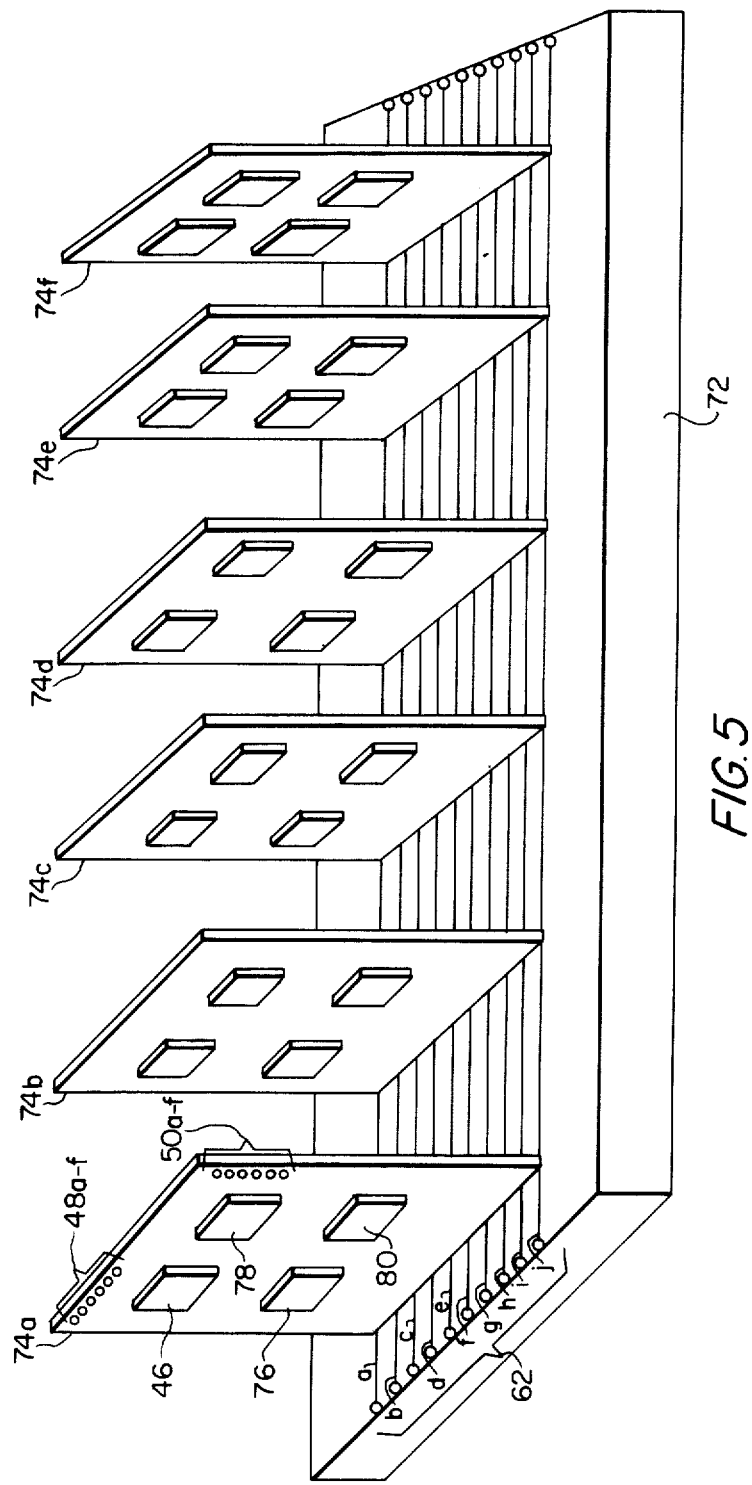
FIG. 5 shows a perspective view of a number of the present invention switching matrices connected onto a common bus of the signal distribution system.

Referring now to FIG. 5, there is shown, for example, base 72 of switching system 34. Formed on top of base 72 are the ten signal buses 62a–62j of intercard signal bus 62. As is shown, the data lines of intercard signal bus 62 are etched along the length of base 72. Connected to the intercard signal bus are six signal distribution cards 74a–74f. It should be appreciated that the number of signal distribution cards is used for illustration purposes only and this number is not meant to be limiting. On each of the signal distribution cards are four identical switching modules. Since the modules are identical, suffice it to note that only switching module 46 has been designated as such on signal distribution card 74a. Again, it should be noted that the number of switching modules on each card is not meant to be limited to only that number. As each of the signal distribution cards is identical, attention is drawn only to card 74a, wherein a number of I/O interface ports 48a–48f are drawn. These I/O ports are used by switching module 46 for interfacing with any equipment under test. As each of the modules, for example, modules 76, 78 and 80 which are connected to signal distribution cards 74a, has six I/O interface ports, a total of 24 I/O interface ports are actually represented on signal distribution card 74a. Also to be noted on signal distribution card 74a are digital outputs 50a–50f. Again, it should be appreciated that these digital data lines are representative only of those of switching module 46.

For the sake of clarity, the hybrid controllers, which are used to control the switching modules and which have been described at length in the aforesaid co-pending application, although also located on the signal distribution card (and which, in fact, can be located within the switching modules themselves), are not shown. Too, for the sake of clarity, a number of other input/output interfaces, for example instrument input/output 71, have not been drawn on signal distribution card 74a. As for the other signal instrument cards 74b–74f, the input/output interfaces are completely omitted. However, such interfaces do exist on each of the signal distribution cards and that each card is not limited to only the number of switching modules shown. Assuming that there are, in fact, four switching modules on each card and six I/O interface ports for each switching module, there would naturally be available in each signal distribution card 144 I/O interface ports available for testing equipment.

Figure 6:
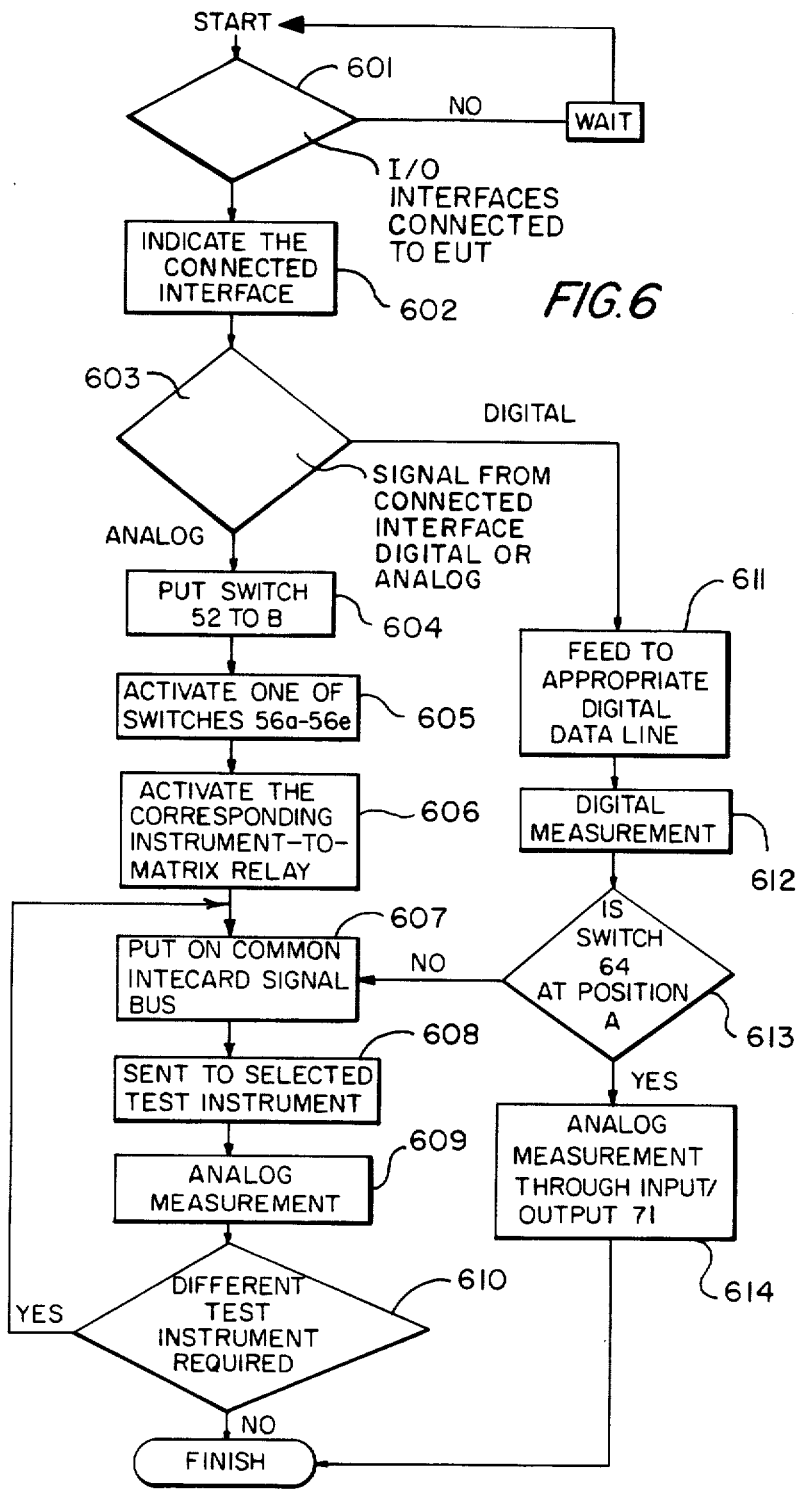
FIG. 6 depicts a flow chart showing the control of a switching module by a hybrid controller.

FIG. 6 depicts a flow diagram showing the selection of different data buses for measuring either the analog or digital signals of the equipment under test by different test instruments. As can easily be ascertained by a person skilled in the art, the flow chart shows the activation of different relays within a switching module, limited to switching module 46 in this instance, by the corresponding hybrid controller, upon receiving instructions from the central processing unit.

To demonstrate, whether or not any of the I/O Interfaces 48a to 48f is connected to an equipment under test is sensed in block 601. If the I/O Interfaces are not connected to an equipment, then the controller controlling switching matrix 46 would enter into a "wait" loop, until, per block 602, there is an indication that a connection exists between an equipment and the I/O Interfaces 48a to 48f. Next, in block 603, the signal being transmitted from the equipment is tested to see if it is an analog or digital signal. If it is an analog signal, one of the switches 52—for this instance assuming that I/O Interface 48f is connected to and communicating with an equipment under test-switch 52f would be set to position b, per indication in block 604. Following the connection of switch 52f to position b, one of the switches 56a to 56e thereof may be activated so as to complete a connection therefrom to lines 65a to 65e, and consequently to instrument-to-bus matrix 60, as shown in block 606. For example, assuming that switch 56d is activated for connecting line 65d, then instrument-to-bus matrix 60g may be activated so as to put on intercard signal bus 62 at output 6 thereof the analog signals transmitted from the equipment, connected to I/O Interface 48f, as shown in block 607. Meanwhile in block 608, it is shown that the analog signals are also sent to a selected test instrument where an analog measurement is made in block 609. And if a different test instrument is required, as shown in block 610, then steps 607 to 610 are repeated. If, on the other hand, the signals from the equipment connected to I/O Interface 48f are digital signals, then these signals are fed to an appropriate digital data line, per block 611. The digital data line, in this example, is line 50f. As was mentioned previously, a digital test equipment may be connected to digital line 50f in order to measure the digital signals therefrom, per block 612. After the measurement, whether switch 64 is at position a is detected by the controller, per block 613. If it is, then an analog measurement is made of the signals through input/output 71, via an instrument such as an oscilloscope, per block 614. If switch 64 is in fact connected to position b, then the program would proceed to block 607 where the signals would again be put n one of the outputs of the intercard signal bus 62.

In brief, the present invention switching module demonstrates that an equipment under test can be connected to both digital and analog test instruments for measuring both digital and analog signals sent thereby. And because of the modularity of the switching modules, the analog signals of the equipment under test can be sent to different test instruments for measuring different analog parameters through the intercard signal bus. The connection of an equipment under test to a particular test instrument is accomplished by means of selectively activating chosen relays in one or more of the switching modules.

While a preferred embodiment of the invention is disclosed herein for purposes of explanation, numerous changes, modifications, variations, substitutions and equivalents, in whole or in part, will now be apparent to those skilled in the art to which the invention pertains. Accordingly, it is intended that the invention be limited only by spirit and scope of the appended claim.

We claim:

1. In a signal distribution system having multiple switching matrix means for effecting connection between an equipment under test and at least one of a plurality of instruments, an interfacing means for connecting the equipment under test to a switching matrix means, each of the switching matrix means including a plurality of relays adapted to be selectively controlled by at least one controller means, each switching matrix means comprising:

a plurality of I/O ports connected to the interfacing means, at least one of the I/O ports communicating with the equipment under test;

a corresponding number of first data lines each connectable directly to one of the I/O ports for providing digital signals from the equipment under test to at least one digital test instrument for measurement, at least one of the first data lines being connected to a switch means adaptable to connect that data line to a first analog instrument so that analog parameters of the digital signals transmitted on that data line are measured by the first analog instrument;

an instrument-to-bus matrix means for effecting communication between the switching matrix means and an intercard signal bus, the instrument-to-bus matrix means including a plurality of second data lines each having a relay means;

multiple matrix buses, corresponding in number to the I/O ports, each connectable to a particular I/O port for selectively providing a signal path between that I/O port and one of the second data lines of the instrument-to-bus matrix means, the one second data line connectable to at least an instrument means.

2. The switching matrix means according to claim 1, wherein each I/O port further comprises a two-way switching means for connecting the I/O port to either the corresponding first data line or the corresponding matrix bus.

3. The switching matrix means according to claim 1, wherein each matrix bus includes a plurality of relay means.

4. The switching matrix means according to claim 3, wherein the number of relay means of the instrument-to-bus matrix means is greater than the number of relay means of the matrix bus.

5. The switching matrix means according to claim 4, wherein each matrix bus of the multiple matrix buses has only one relay means operative at any one time.

6. The switching matrix means according to claim 1, wherein the at least one controller means is connected to a central processing unit for receiving instructions therefrom; and wherein the relay means and the switching means are controllably activated by the at least one controller means.

7. The switching matrix means according to claim 1, wherein the instrument means is a second analog instrument and wherein the signal path provides analog signals from the equipment under test to the second analog instrument for measurement.

8. The switching matrix means according to claim 1, wherein the instrument means is a stimulus instrument and wherein the signal path transmits stimulus signals sent from the instrument means to stimulate the equipment under test so as to elicit a response therefrom.

9. In a signal distribution system having multiple switching matrix means for selectively connecting an equipment under test to at least one of a plurality of instruments, each switching matrix means being controlled by at least one controller means, the switching matrix means comprising:

a plurality of I/O ports, at least one of the I/O ports being connected to the equipment under test;

corresponding first switching means connected in a one-to-one relationship to the plurality of I/O ports;

corresponding first data lines, each of the first data lines being connectable via a corresponding first switching means to a corresponding I/O port for providing digital signals from the equipment under test to a digital test instrument for measurement;

multiple matrix buses, corresponding in number to the I/O ports, each connectable via a corresponding first switching means to a particular I/O port for selectively providing a signal path between that I/O port and one of a plurality of second data lines, each of the matrix buses including a plurality of relay means;

wherein at least one of the first data lines is connected to a second switch means connectable to an analog instrument for measuring the analog parameters of the digital signals on that one first data line; and wherein at least one of the second data lines is connectable to an instrument means.

10. The switching matrix means according to claim 9, wherein each matrix bus includes a plurality of relay means.

11. The switching matrix means according to claim 10, wherein each matrix bus of the multiple matrix buses has only one relay means operative at any one time.

12. The switching matrix means according to claim 11, wherein the at least one controller means is connected to a central processing unit for receiving instructions therefrom; and wherein the relay means and the switching means are controllably activated by the at least one controller means.

13. The switching matrix according to claim 9, wherein if the instrument means is a test instrument, signals from the equipment under test are sent via the signal path to the test instrument; and wherein, if the instrument means is a stimulus instrument, stimulating signals are sent from the stimulus instrument to the equipment under test for eliciting a response therefrom.

* * * * *

UNITED STATES PATENT AND TRADEMARK OFFICE
CERTIFICATE OF CORRECTION

PATENT NO. : 4,719,459
DATED : January 12, 1988
INVENTOR(S) : Eddie T. Kovacs, et al.

It is certified that error appears in the above-identified patent and that said Letters Patent is hereby corrected as shown below:

Column 2, line 32, change "anyone" to --any one--.

Column 3, line 21, change "58" to --68--.

Column 5, line 15, change "cards" to --card--.

Column 6, line 24, change "n" to --on--.

Column 6, line 43, change "claim" to --claims--.

Signed and Sealed this

Fourteenth Day of June, 1988

*Attest:*

DONALD J. QUIGG

*Attesting Officer*  *Commissioner of Patents and Trademarks*